US012401105B2

(12) United States Patent
Kim et al.

(10) Patent No.: US 12,401,105 B2
(45) Date of Patent: Aug. 26, 2025

(54) WAVEGUIDE MODULE COMPRISING A WAVEGUIDE ON A METAL JIG, WHERE THE METAL JIG INCLUDES A TRENCH STRUCTURE WITH A RADIO WAVE ABSORBER DISPOSED THEREIN

(71) Applicant: ELECTRONICS AND TELECOMMUNICATIONS RESEARCH INSTITUTE, Daejeon (KR)

(72) Inventors: Sooyeon Kim, Daejeon (KR); Seung Hwan Kim, Daejeon (KR); Seung-Hyun Cho, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 261 days.

(21) Appl. No.: 18/127,075

(22) Filed: Mar. 28, 2023

(65) Prior Publication Data

US 2023/0327307 A1   Oct. 12, 2023

(30) Foreign Application Priority Data

Apr. 8, 2022  (KR) .......................... 10-2022-0044096

(51) Int. Cl.
*H01P 1/162*  (2006.01)
*H01P 11/00*  (2006.01)
*H05K 5/04*  (2006.01)

(52) U.S. Cl.
CPC ............ *H01P 1/162* (2013.01); *H01P 11/003* (2013.01); *H05K 5/04* (2013.01)

(58) Field of Classification Search
CPC ...................................................... H01P 1/162
(Continued)

(56) References Cited

U.S. PATENT DOCUMENTS 5,030,935 A * 7/1991 Williams et al. ....... H01P 1/162
361/753
7,659,799 B2   2/2010 Jun et al.
(Continued)

FOREIGN PATENT DOCUMENTS

KR  10-2004-0034077 A   4/2004
KR  10-2021-0132176 A   11/2021

OTHER PUBLICATIONS

Chang Mook Choi et al., "Development of EM Wave Absorber for Millimeter Wave Radar", The Korea Institute of Information and Communication Engineering, 2006.

*Primary Examiner* — Benny T Lee
(74) *Attorney, Agent, or Firm* — LRK PATENT LAW FIRM

(57) ABSTRACT

Provided is a waveguide module for improving insertion loss and return loss. The waveguide module includes a metal jig including a waveguide through which a radio wave is transmitted and received formed therein, a chip disposed on the waveguide formed in the metal jig and including a plurality of circuits that is configured to transmit and receive radio waves inside the waveguide, and a circuit board configured to provide a bias used for an operation of the chip, wherein the metal jig includes a trench structure to dispose a radio wave absorber on a side surface of the chip in a direction crossing the waveguide.

12 Claims, 7 Drawing Sheets

(58) Field of Classification Search
USPC .......................................................... 333/251
See application file for complete search history.

(56) References Cited

U.S. PATENT DOCUMENTS

| | | |
|---|---|---|
| 9,583,811 B2 | 2/2017 | Seler et al. |
| 2013/0194754 A1 | 8/2013 | Jung et al. |
| 2015/0280299 A1 | 10/2015 | Lee et al. |
| 2021/0313765 A1 | 10/2021 | Ogawa |

* cited by examiner

WAVEGUIDE MODULE COMPRISING A WAVEGUIDE ON A METAL JIG, WHERE THE METAL JIG INCLUDES A TRENCH STRUCTURE WITH A RADIO WAVE ABSORBER DISPOSED THEREIN

CROSS-REFERENCE TO RELATED APPLICATION(S)

This application claims the benefit of Korean Patent Application No. 10-2022-0044096 filed on Apr. 8, 2022, in the Korean Intellectual Property Office, the entire disclosure of which is incorporated herein by reference for all purposes.

BACKGROUND

1. Field of the Invention

One or more embodiments relate to a waveguide module, and more particularly, to a structure of a waveguide module that may improve insertion loss and return loss due to an unnecessary mode generated inside a waveguide.

2. Description of Related Art

Circuits such as passive devices, amplifiers, mixers, oscillators, or transceivers may be modularized by mounting a circuit board such as a semiconductor chip inside a waveguide, which may be referred to as a "waveguide module". As an operating frequency increases to the millimeter band or sub-millimeter band, as a wavelength decreases, an unnecessary mode may be generated inside the waveguide due to a physical arrangement of a chip and surrounding structures, and accordingly, the possibility of deteriorating the performance of the waveguide module may be drastically increased.

In particular, there is a high probability that the unnecessary mode (hereinafter, referred to as a "substrate mode") will be generated on a substrate of a chip, and a main factor that affects the generation of the substrate mode is a space between the chip and the waveguide, error in chip attachment position, manufacturing error in a waveguide metal jig, etc. To suppress such a substrate mode when manufacturing the chip, there is a method of densely disposing vias for a backside. However, there are many semiconductor processes that do not provide the vias for a backside due to a problem of an additional necessary process, and there is a case where the vias for a backside significantly restricts a layout of a circuit due to a design rule or a substrate structure. In addition, at a high operating frequency, a minimum space between the vias for a backside increases, so it may not be possible to dispose the vias for a backside densely enough to suppress the substrate mode.

Therefore, when the unnecessary mode inside the waveguide is generated at a frequency in the operating frequency band of the chip, a frequency flatness characteristics may be greatly deteriorated, so there is a demand for a method of suppressing a parasitic mode of the waveguide module that may improve the deterioration.

In addition, a space between the vias for a backside and a metal wall of the waveguide decreases when a space between the chip and the waveguide decreases. This can reduce possibility of the generation of the substrate mode. However, it can be significantly difficult to attach the chip. Accordingly, a method of manufacturing the waveguide module that may reduce the space between the chip and the waveguide is also required.

SUMMARY OF THE INVENTION

Embodiments provide a structure of a waveguide module that may improve insertion loss and return loss due to an unnecessary mode generated inside a waveguide by assembling a radio wave absorber or a metal structure together when a chip is mounted inside the waveguide.

In addition, embodiments provide a waveguide module structure that may suppress the generation of unnecessary modes by reducing the space between the chip and the waveguide.

According to an aspect, a waveguide module is provided, a metal jig with a waveguide formed inside, a chip disposed inside the waveguide on the metal jig, and a circuit board that supplies bias to the chip. The metal jig includes trench structures on side surfaces of the chip, where a radio wave absorber can be placed.

The radio wave absorber may be produced by processing a radio wave absorbing structure to fit the trench structure or by curing a radio wave absorbing paste to correspond to the trench structure.

The circuit board may be connected to an upper surface of the radio wave absorber through a conductive adhesive.

The waveguide module may further include a single-layer capacitor (SLC) disposed on an upper surface of the radio wave absorber. The SLC may be connected to the chip and the circuit board through a wire-bonding.

A space between the radio wave absorber disposed on the side surface of the chip and the trench structure may be filled with a conductive adhesive or a radio wave absorbing adhesive.

According to an aspect, a waveguide module is provided, a metal jig with a waveguide formed inside the metal jig, a chip disposed inside the waveguide on the metal jig, and a circuit board that supplies bias to the chip. The metal jig includes trench structures on side surfaces of the chip, where a radio wave absorber can be placed, wherein an upper height of the radio wave absorber disposed in the trench structure is determined to be less than an upper height of the chip.

The upper height of the radio wave absorber may be formed to decrease as the radio wave absorber approaches a waveguide transition and formed to increase as the radio wave absorber distances from the waveguide transition.

The radio wave absorber may be produced by processing a radio wave absorbing structure to fit the trench structure or by curing a radio wave absorbing paste to correspond to the trench structure.

The circuit board may be connected to an upper surface of the radio wave absorber through a conductive adhesive.

The waveguide module may further include a single-layer capacitor (SLC) disposed on an upper surface of the radio wave absorber. The SLC may be connected to the chip and the circuit board through a wire-bonding.

A space between the radio wave absorber disposed on a side surface of the chip and the trench structure may be filled with a conductive adhesive or a radio wave absorbing adhesive.

According to an aspect, a waveguide module is provided, a metal jig with a waveguide formed inside the metal jig, a chip disposed inside the waveguide on the metal jig, and a circuit board that supplies bias to the chip. The metal jig includes trench structures on side surfaces of the chip, where a radio wave absorber can be placed, wherein an upper height of the metal structure disposed in the trench structure is less than an upper height of the chip, and formed to decrease as the metal structure approaches a waveguide transition and formed to increase as the metal structure distances from the waveguide transition.

The metal structure may be generated by processing a metal to correspond to the trench structure or by curing a conductive paste to correspond to the trench structure.

Additional aspects of embodiments will be set forth in part in the description which follows and, in part, will be apparent from the description, or may be learned by practice of the disclosure.

According to embodiments, a structure of a waveguide module capable of improving insertion loss and reflection loss due to unnecessary modes generated inside the waveguide by assembling a radio wave absorber or a metal structure when a chip is mounted inside the waveguide is provided.

In addition, according to one embodiment of the present invention, it is possible to provide a structure of a waveguide module capable of reducing the distance between the chip and the waveguide to improve transmission and suppress the occurrence of unnecessary modes.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION OF THE INVENTION

Hereinafter, embodiments will be described in detail with reference to the accompanying drawings.

Figures 1A, 1B:
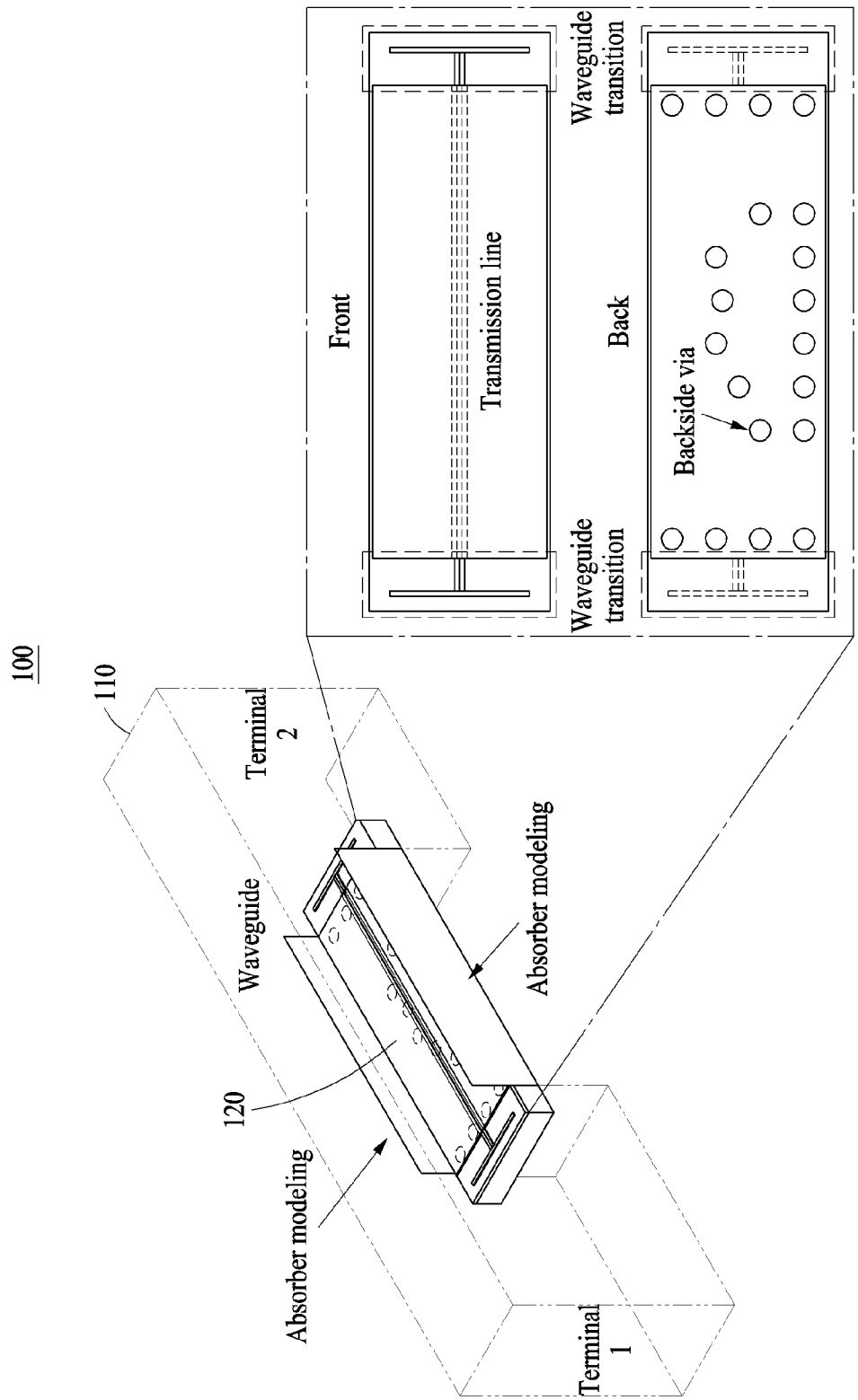
FIGS. 1A and 1B are conceptual diagrams illustrating a waveguide module according to an embodiment.

FIGS. 1A and 1B are conceptual diagrams illustrating a waveguide module according to an embodiment.

Referring to FIG. 1A, a waveguide module 100 may include a waveguide 110 formed of a conductive metal pipe having a hollow interior and a chip 120 formed of a plurality of circuits to transmit and receive a radio wave inside the waveguide 110. The waveguide module 100 may include a first terminal (Terminal 1) located at one end and a second terminal (Terminal 2) located at the opposite end, each of which functions as a waveguide interface or transmission terminal for transmitting and receiving the radio wave.

Referring to FIG. 1B, the chip 120 disposed in the waveguide 110 may include a transmission line formed on a front surface, an input/output unit connected to a waveguide transition and may be connected to ground by bonding with the waveguide 110 through a via for a backside and a metal that is formed on a lower surface of the chip 120.

As described above, as a wavelength decreases when an operating frequency increases to a millimeter band or a sub-millimeter band, an unnecessary mode may be generated inside the waveguide 110 due to the chip 120 and a physical arrangement of surrounding structures. As a result, features of insertion loss and return loss deteriorate, and the possibility of deteriorating the performance of the waveguide module 100 may drastically increase.

Here, most of the unnecessary modes generated in the waveguide module 100 may be a substrate mode generated in a substrate of the chip 120 and an arrangement of the substrate and a ground plane. Therefore, when the radio wave is absorbed on a side surface of the chip 120, the generation of such a substrate mode may be significantly reduced, and accordingly, the features of the insertion loss and the return loss for the waveguide module 100 may be improved.

To this end, the waveguide module 100 of the present disclosure may provide an absorber modeling for absorbing the radio wave on the side surface of the chip 120, as shown in FIG. 1A. Through the absorber modeling, the insertion loss and the return loss due to the unnecessary mode including the substrate mode generated inside the waveguide 110 may be improved.

Figure 2:
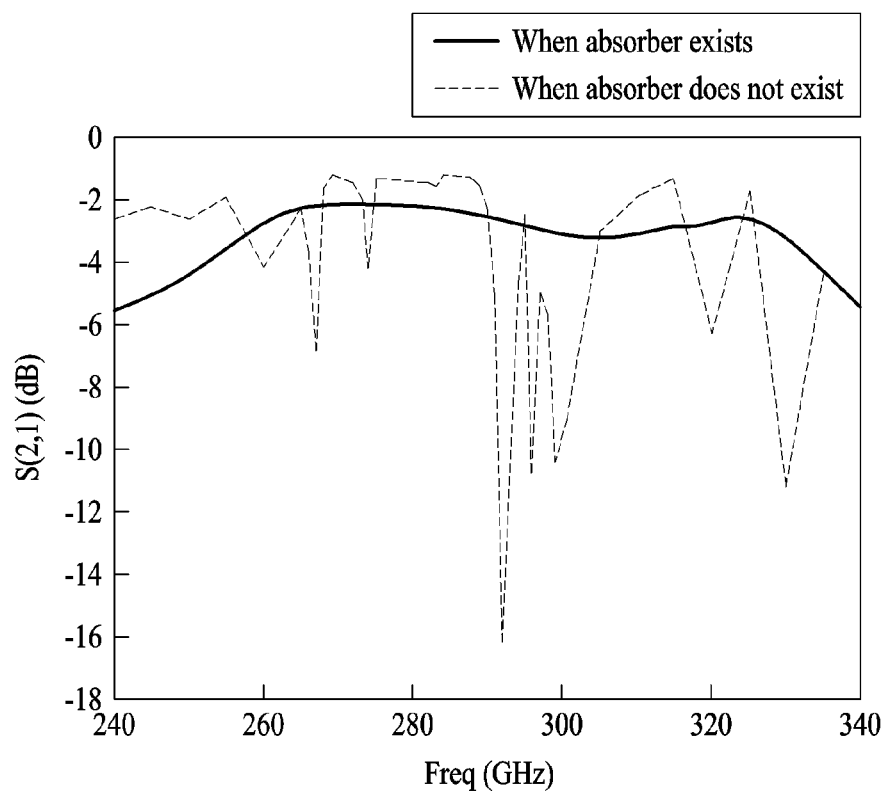
FIG. 2 is a diagram illustrating a result obtained by simulating an effect by simply modeling a structure of a waveguide module according to an embodiment.

FIG. 2 is a diagram illustrating a result obtained by simulating an effect by simply modeling a structure of a waveguide module according to an embodiment.

The waveguide module 100 of the present disclosure may provide the absorber modeling for absorbing the radio wave on the side surface of the chip 120, as shown in FIG. 1A. In this case, when an absorber is on the side surface of the chip 120, the insertion loss and the return loss of the waveguide module 100 are improved compared to a case in which the absorber is not thereon. For example, referring to FIG. 2, it can be confirmed that the insertion loss S(2,1) of the waveguide module 100 is lower when the absorber is on the side surfaces of the chip 120, as compared to when the absorber is not thereon.

However, in many cases, components for applying bias or control signals to the chip 120 must be located around the chip 120, and the sizes of the chip 120 and a waveguide structure decrease as frequency increases, so there is a problem that the simulation structure shown in FIG. 1A is difficult to implement.

Figure 3:
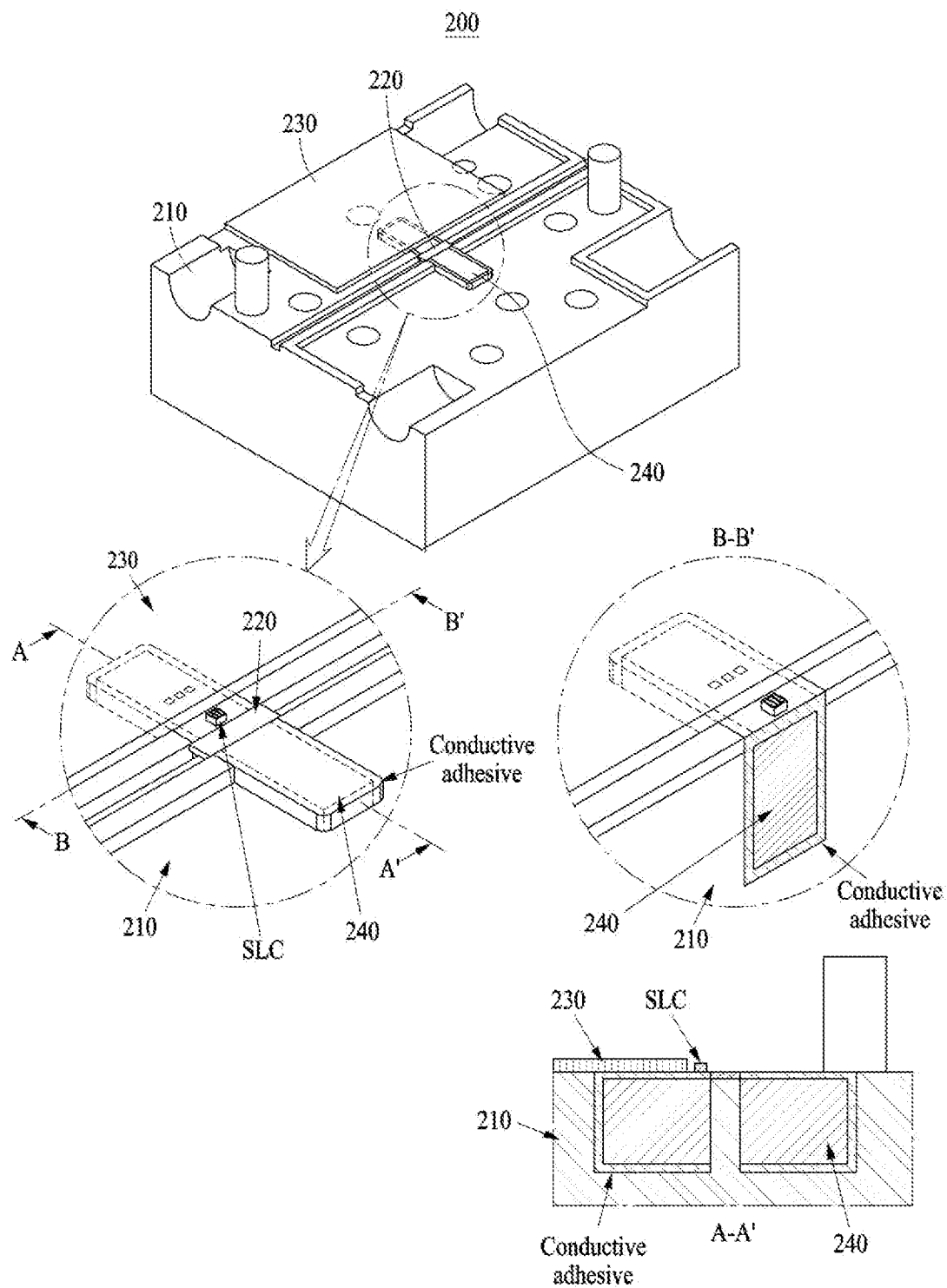
FIG. 3 is a diagram illustrating a structure of a waveguide module according to an embodiment.
Figure 4:
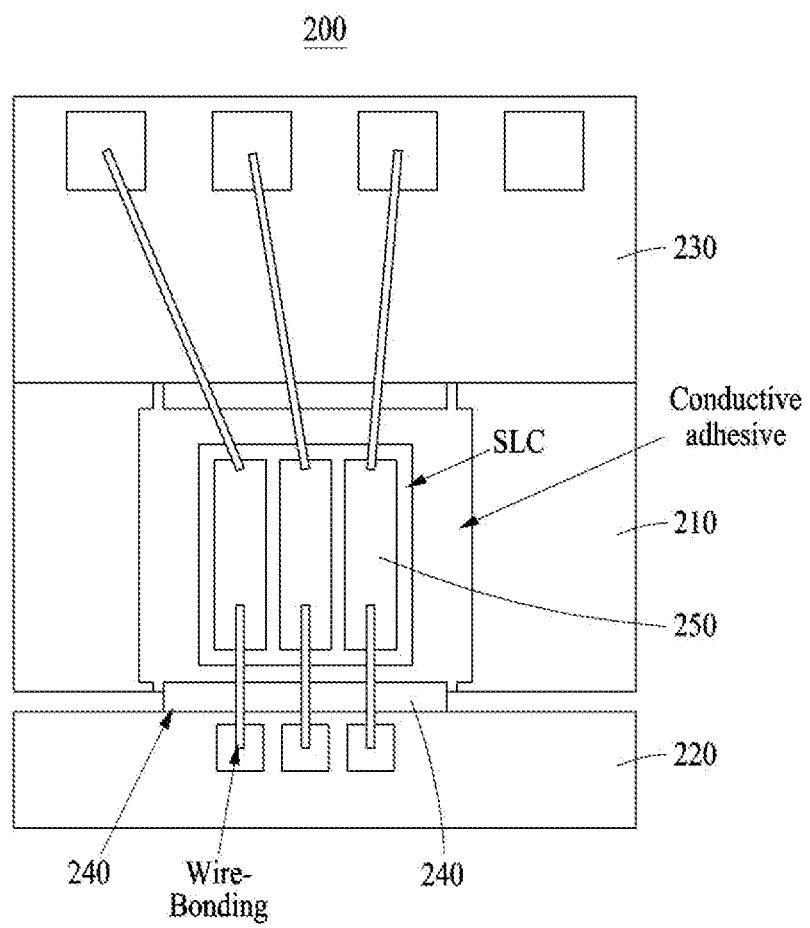
FIG. 4 is a plan view illustrating a waveguide module according to an embodiment.

FIG. 3 is a diagram illustrating the structure of a waveguide module according to an embodiment and FIG. 4 is a plan view illustrating the waveguide module according to an embodiment.

FIG. 3 illustrates a structure of a waveguide module 200 according to an embodiment, and for the convenience of description, a dipole-shaped waveguide transition structure is described as an example and may be similarly applied to other types of waveguide transitions. In addition, FIG. 4 is a plan view illustrating the waveguide module 200.

The waveguide module 200 in FIGS. 3 and 4 may include a metal jig 210 having a waveguide through which a radio wave is transmitted and received, a chip 220 disposed in the waveguide formed on the metal jig 210 and including a plurality of circuits that is configured to transmit and receive the radio wave inside the waveguide, and a circuit board 230 that provides a bias for driving of the chip 220.

Here, the metal jig 210 may have a trench structure to dispose a radio wave absorber 240 in a direction crossing the waveguide from the side surface of the chip 220.

First, when the chip 220 is disposed in the waveguide that is formed in the metal jig 210, the radio wave absorber 240 generated by processing a radio wave absorbing structure to correspond to the trench structure or by curing a radio wave absorbing paste to correspond to the trench structure may be disposed in the corresponding trench structure.

Here, a space between the metal jig 210 and the radio wave absorber 240 disposed in the trench structure may be filled using a conductive adhesive or a radio wave absorbing adhesive. This method may reduce the processing difficulty by utilizing the radio wave absorber 240 having a sufficient size. When the radio wave absorber 240 is formed thin, the radio wave absorber 240 may not absorb sufficient waves, and accordingly, a phenomenon in which the removal performance of the unnecessary mode deteriorates may be prevented.

Furthermore, the conductive adhesive may be applied on the radio wave absorber 240 and a single-layer capacitor (SLC) 250 as shown in FIG. 4 and the circuit board 230 may be attached. Through this, the SLC 250 and a lower surface of the circuit board 230 may be electrically connected to the ground plane.

A wire bonding is applied between the chip 220 and the circuit board 230 in the attached SLC 250, so that the chip 220 and the circuit board 230 for applying the bias signal or the control signal to the chip 220 may be connected to each other.

The above structure of the waveguide module 200 may improve electrical properties of the waveguide module 200 by suppressing the unnecessary mode, particularly the substrate mode, which occurs in the manufacturing process, and may save semiconductor process cost because no additional semiconductor process is required.

In addition, the structure of the waveguide module 200 of the present disclosure may improve the circuit performance and reduce a chip area by relieving a layout constraint of the circuit according to a suppression method according to the related art that suppresses the generation of the substrate mode by densely disposing vias for the backside, may suppress the unnecessary mode due to the space between the chip 220 and the waveguide, and may improve the radio wave loss amount of the waveguide transition.

Figure 5:
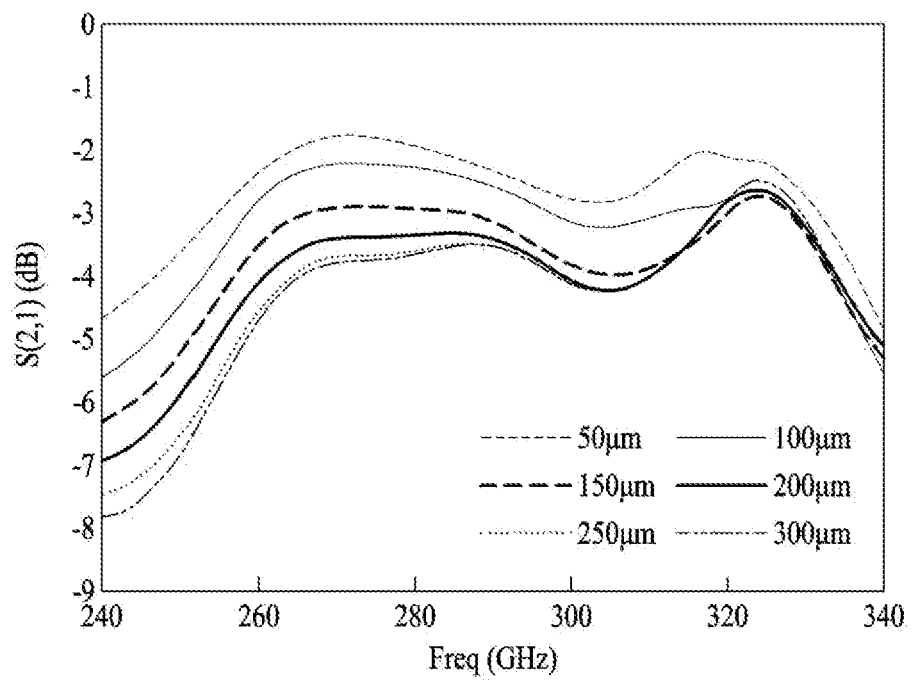
FIG. 5 is a diagram illustrating a simulation result when a height of a radio wave absorber is adjusted according to an embodiment.
Figure 6:
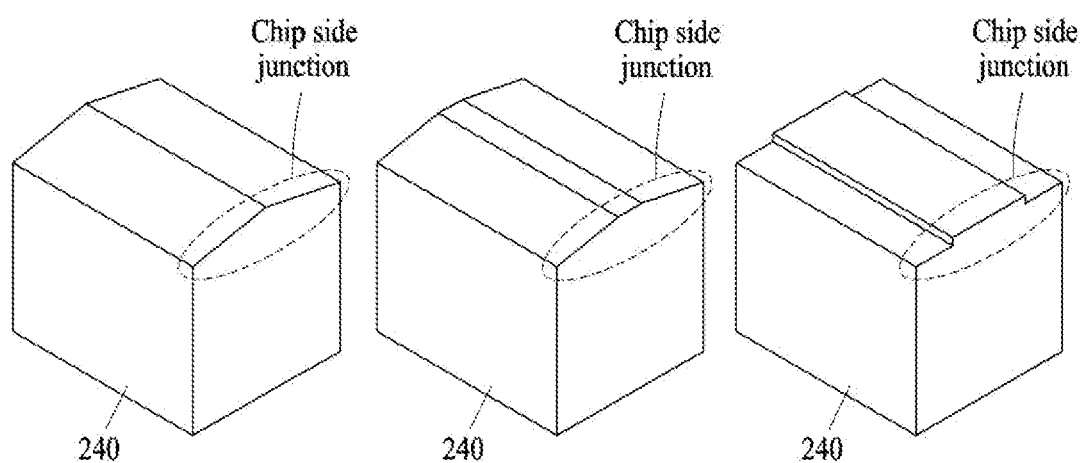
FIG. 6 is a diagram illustrating a shape of a chip side junction of the radio wave absorber according to an embodiment.

FIG. 5 is a diagram illustrating a simulation result when a height of a radio wave absorber is adjusted according to an embodiment and FIG. 6 is a diagram illustrating a shape of a chip side junction of the radio wave absorber according to an embodiment.

In the present disclosure, as the height of the radio wave absorber 240 increases, the effect of the waveguide module 200 to suppress the unnecessary mode may be improved, but the radio wave loss amount of the waveguide transition may increase. In an example, when a lower height of a chip is 0 micrometers (μm) and an upper height (the thickness of the chip) of the chip is 85 μm, FIG. 5 shows a simulation result according to an upper height change of the radio wave absorber (50 μm, 100 μm, 150 μm, 200 μm, 250 μm, 300 μm). Referring to the simulation result, the insertion loss S(2,1) of the waveguide module 200 decreases as the upper height of the radio wave absorber 240 disposed in the trench structure becomes lower than the upper height of the chip 220. It may be confirmed that a waveguide-to-substrate signal transmission amount feature is excellent and the unnecessary mode is effectively suppressed.

Here, by considering a trade-off between the waveguide-to-substrate signal transmission amount and the suppression effect of the unnecessary mode, the present disclosure may form a chip side junction of the radio wave absorber 240 as shown in FIG. 6.

More specifically, the present disclosure may suppress the generation of the unnecessary mode by forming the height of the radio wave absorber 240 to be lower corresponding to a region far from the waveguide transition to reduce radio wave loss as the radio wave absorber 240 is closer to the waveguide transition that forms the chip 220 and by forming the height of the radio wave absorber 240 to be higher corresponding to a region closer to the waveguide transition as the radio wave absorber 240 is away from the waveguide transition.

Figure 7:
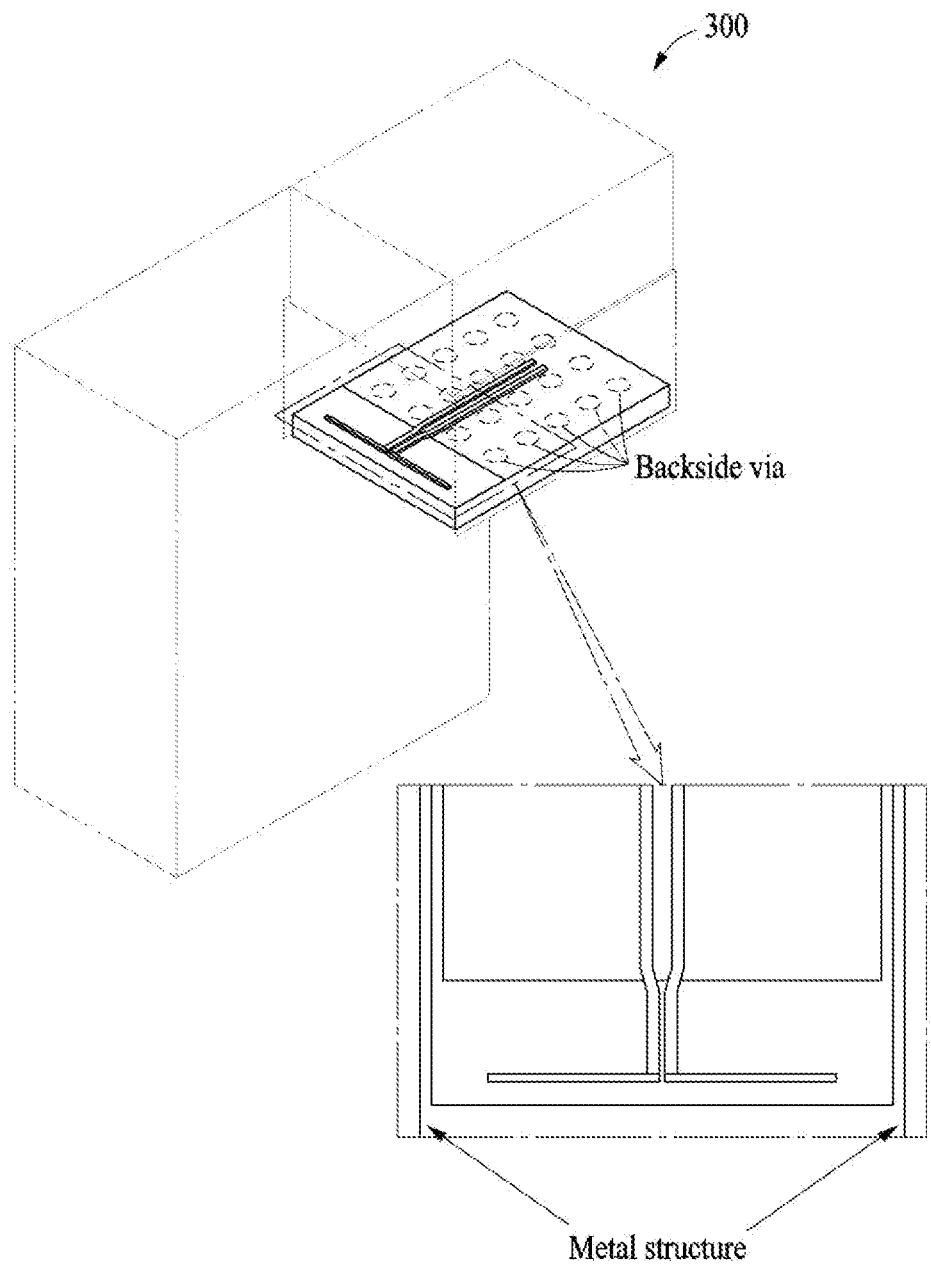
FIG. 7 is a diagram illustrating a simulation structure for a case in which a radio wave absorber is replaced with a metal structure according to an embodiment.
Figure 8:
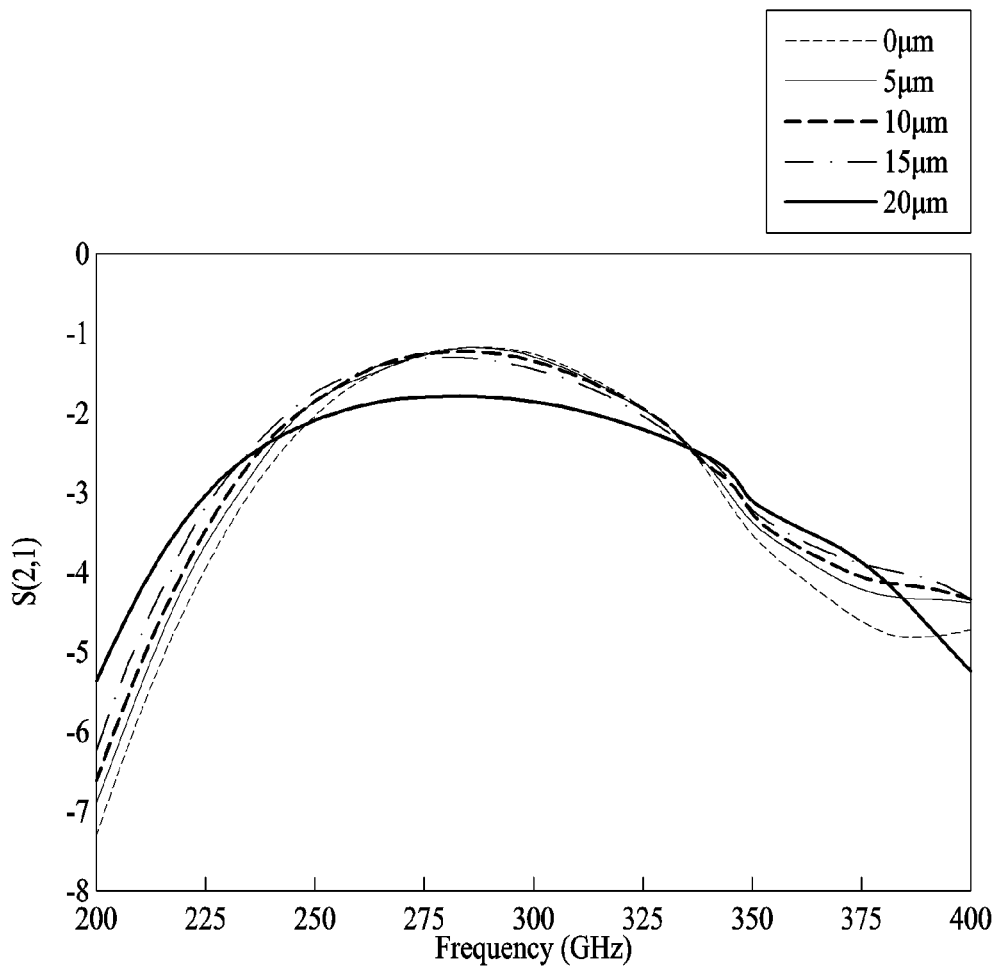
FIG. 8 is a diagram illustrating a simulation result of a signal transmission amount according to a space between a chip and a metal structure disposed in a trench structure on a side of a chip according to an embodiment.

FIG. 7 is a diagram illustrating a simulation structure for a case in which a radio wave absorber is replaced with a metal structure according to an embodiment and FIG. 8 is a diagram illustrating a simulation result according to the simulation structure.

Referring to FIG. 7, a waveguide module 300 of the present disclosure is substantially similar to the structure of the waveguide module 200 in FIGS. 3 and 4 described above but may provide a method of suppressing the generation of an unnecessary mode by replacing a radio wave absorber with a metal structure and of improving the transmission amount feature of waveguide transition.

Here, the metal structure may be generated by processing a metal to correspond to the trench structure or by curing a conductive paste a conductive paste to correspond to the trench structure and may be disposed in the corresponding trench structure.

FIG. 8 is a diagram illustrating a simulation result of a signal transmission amount according to the space (0 μm, 5 μm, 10 μm, 15 μm, 20 μm) between a chip and the metal structure disposed in the trench structure on the side of the chip. Referring to FIG. 8, it can be seen that the insertion loss S(2,1) of the waveguide module 300 decreases as the spacing between the chip and the metal structure increases. When the space between the chip and the metal structure increases to 20 μm or more, it may be confirmed that the feature of the waveguide module drastically deteriorates.

However, in the general method of attaching the chip in a state where the metal structure is disposed, the space between the chip and the metal structure must be several tens of μm due to the difficulty of attaching the chip.

Therefore, the manufacturing method of disposing the metal structure after attaching the chip as in the present disclosure has an advantage in that the transmission feature of the waveguide transition may be improved by significantly reducing the space between the chip and the metal structure.

The method according to embodiments may be written in a computer-executable program and may be implemented as various non-transitory recording media such as magnetic storage media, optical reading media, or digital storage media.

Various techniques described herein may be implemented in digital electronic circuitry, computer hardware, firmware, software, or combinations thereof. The implementations may be achieved as a computer program product, for example, a computer program tangibly embodied in a non-transitory machine readable storage device (a computer-readable medium) to process the operations of a data processing device, for example, a programmable processor, a computer, or a plurality of computers or to control the operations. A computer program, such as the computer program(s) described above, may be written in any form of a programming language, including compiled or interpreted languages, and may be deployed in any form, including as a stand-alone program or as a module, a component, a subroutine, or other units suitable for use in a computing environment. A computer program may be deployed to be processed on one computer or multiple computers at one site or distributed across multiple sites and interconnected by a communication network.

Processors suitable for processing of a computer program include, by way of example, both general and special purpose microprocessors, and any one or more processors of any kind of digital computer. Generally, a processor will receive instructions and data from a read-only memory (ROM) or a random access memory (RAM), or both. Elements of a computer may include at least one processor for executing instructions and one or more memory devices for storing instructions and data. Generally, a computer also may include, or be operatively coupled to receive data from or transfer data to, or both, one or more non-transitory mass storage devices for storing data, e.g., magnetic, magneto-optical disks, or optical disks. Examples of information carriers suitable for embodying computer program instructions and data include semiconductor memory devices, for example, magnetic media such as hard disks, floppy disks, and magnetic tape, optical media such as compact disc ROMs (CD-ROMs) or digital versatile discs (DVDs), magneto-optical media such as floptical disks, ROMs, RAMs, flash memories, erasable programmable ROMs (EPROMs), or electrically erasable programmable ROMs (EEPROMs). The processor and the memory may be supplemented by, or incorporated in special purpose logic circuitry.

In addition, non-transitory computer-readable media may be any available media that may be accessed by a computer and may include both computer storage media and transmission media.

Although the present specification includes details of a plurality of specific embodiments, the details should not be construed as limiting any invention or a scope that can be claimed, but rather should be construed as being descriptions of features that may be peculiar to specific embodiments of specific inventions. Specific features described in the present specification in the context of individual embodiments may be combined and implemented in a single embodiment. On the contrary, various features described in the context of a single embodiment may be implemented in a plurality of embodiments individually or in any appropriate sub-combination. Moreover, although features may be described above as acting in specific combinations and even initially claimed as such, one or more features from a claimed combination can in some cases be excised from the combination, and the claimed combination may be changed to a sub-combination or a modification of a sub-combination.

Likewise, although operations are depicted in a predetermined order in the drawings, it should not be construed that the operations need to be performed sequentially or in the predetermined order, which is illustrated to obtain a desirable result, or that all of the shown operations need to be performed. In specific cases, multi-tasking and parallel processing may be advantageous. In addition, it should not be construed that the separation of various device components of the aforementioned embodiments is required in all types of embodiments, and it should be understood that the described program components and devices are generally integrated as a single software product or packaged into a multiple-software product.

The embodiments disclosed in the present specification and the drawings are intended merely to present specific examples in order to aid in understanding of the present disclosure, but are not intended to limit the scope of the present disclosure. It will be apparent to one of ordinary skill in the art that various modifications based on the technical spirit of the present disclosure, as well as the disclosed embodiments, can be made.

What is claimed is:

1. A waveguide module comprising:
   a metal jig comprising a waveguide through which a radio wave is transmitted and received formed therein;
   a chip disposed on the waveguide formed in the metal jig and comprising a plurality of circuits that is configured to transmit and receive radio waves inside the waveguide; and
   a circuit board configured to provide a bias used for an operation of the chip,
   wherein the metal jig comprises a trench structure to dispose a radio wave absorber on a side surface of the chip in a direction crossing the waveguide,
   wherein an upper height of the radio wave absorber is formed to decrease as the radio wave absorber approaches a waveguide transition and formed to increase as the radio wave absorber distances from the waveguide transition.

2. The waveguide module of claim 1, wherein the radio wave absorber is produced by processing a radio wave absorbing structure to fit the trench structure or by curing a radio wave absorbing paste to correspond to the trench structure.

3. The waveguide module of claim 1, wherein the circuit board is connected to an upper surface of the radio wave absorber through a conductive adhesive.

4. The waveguide module of claim 1, further comprising:
   a single-layer capacitor (SLC) disposed on an upper surface of the radio wave absorber,
   wherein the SLC is connected to the chip and the circuit board through a wire-bonding.

5. The waveguide module of claim 1, wherein a space between the radio wave absorber disposed on the side surface of the chip and the trench structure is filled with a conductive adhesive or a radio wave absorbing adhesive.

6. A waveguide module comprising:
   a metal jig comprising a waveguide through which a radio wave is transmitted and received formed therein, and a trench structure to dispose a radio wave absorber in a direction crossing the waveguide, formed therein;
   a chip disposed on the waveguide formed in the metal jig and comprising a plurality of circuits that is configured to transmit and receive radio waves inside the waveguide; and
   a circuit board configured to provide a bias used for an operation of the chip,
   wherein an upper height of the radio wave absorber disposed in the trench structure is determined to be less than an upper height of the chip,
   wherein the upper height of the radio wave absorber is formed to decrease as the radio wave absorber approaches a waveguide transition and formed to increase as the radio wave absorber distances from the waveguide transition.

7. The waveguide module of claim 6, wherein a space between the radio wave absorber disposed on a side surface of the chip and the trench structure is filled with a conductive adhesive or a radio wave absorbing adhesive.

8. The waveguide module of claim 6, wherein the radio wave absorber is produced by processing a radio wave absorbing structure to fit the trench structure or by curing a radio wave absorbing paste to correspond to the trench structure.

9. The waveguide module of claim 6, wherein the circuit board is connected to an upper surface of the radio wave absorber through a conductive adhesive.

10. The waveguide module of claim 6, further comprising:
- a single-layer capacitor (SLC) disposed on an upper surface of the radio wave absorber,
- wherein the SLC is connected to the chip and the circuit board through a wire-bonding.

11. A waveguide module comprising:
- a metal jig comprising a waveguide through which a radio wave is transmitted and received formed therein;
- a chip disposed on the waveguide formed in the metal jig and comprising a plurality of circuits that is configured to transmit and receive radio waves inside the waveguide; and
- a circuit board configured to provide a bias used for an operation of the chip,
- wherein the metal jig comprises a trench structure to dispose a metal structure on a side surface of the chip in a direction crossing the waveguide, and
- wherein an upper height of the metal structure disposed in the trench structure is less than an upper height of the chip, and formed to decrease as the metal structure approaches a waveguide transition and formed to increase as the metal structure distances from the waveguide transition.

12. The waveguide module of claim 11, wherein the metal structure is generated by processing a metal to correspond to the trench structure or by curing a conductive paste to correspond to the trench structure.

\* \* \* \* \*